US006235599B1

United States Patent
Yu

(10) Patent No.: US 6,235,599 B1
(45) Date of Patent: May 22, 2001

(54) FABRICATION OF A SHALLOW DOPED JUNCTION HAVING LOW SHEET RESISTANCE USING MULTIPLE IMPLANTATIONS

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/426,402

(22) Filed: Oct. 25, 1999

(51) Int. Cl.[7] .................. H01L 21/336; H01L 21/425
(52) U.S. Cl. .................. 438/305; 438/306; 438/528; 438/529
(58) Field of Search .................. 438/528, 529, 438/305, 306

(56) References Cited

U.S. PATENT DOCUMENTS

| | | | |
|---|---|---|---|
| 4,617,066 | * | 10/1986 | Vasudev . |
| 4,683,645 | * | 8/1987 | Naguib et al. . |
| 5,212,101 | * | 5/1993 | Canham et al. . |
| 5,648,288 | * | 7/1997 | Williams et al. . |
| 5,793,090 | * | 9/1998 | Gardner et al. .................. 438/302 |
| 5,953,616 | * | 9/1999 | Ahn .................. 438/305 |
| 6,008,098 | * | 12/1999 | Pramanick et al. .................. 438/305 |
| 6,010,952 | * | 1/2000 | Tsai et al. .................. 438/528 |
| 6,013,546 | * | 1/2000 | Gardner et al. .................. 438/231 |

* cited by examiner

*Primary Examiner*—Richard Booth
*Assistant Examiner*—Ron Pompey
(74) *Attorney, Agent, or Firm*—Monica H. Choi

(57) ABSTRACT

A shallow doped junction that is part of an integrated circuit device within a semiconductor substrate is formed with box-shaped implant profiles for implantation of the amorphizing implant species and the dopant implant species such that the doped junction has minimized sheet resistance. A box-shaped implant profile for implantation of the amorphizing implant species is formed from implantation of the amorphizing implant species with a plurality of projection ranges to form a plurality of implant profiles. A box-shaped implant profile for implantation of the dopant implant species is formed from implantation of the dopant implant species with a plurality of projection ranges to form a plurality of implant profiles. In addition, each of the plurality of implant profiles for the dopant implant species is preferably below the solid solubility of the dopant implant species within the semiconductor substrate. By controlling the implant profiles of the amorphizing implant species and the dopant implant species during fabrication of the doped junction, the sheet resistance of the doped junction is minimized. In addition, the temperature and the time period for activating the dopant implant species in a RTA (Rapid Thermal Anneal) process is also minimized such that the doped junction remains relatively shallow.

19 Claims, 4 Drawing Sheets ively narrow.

FABRICATION OF A SHALLOW DOPED JUNCTION HAVING LOW SHEET RESISTANCE USING MULTIPLE IMPLANTATIONS

TECHNICAL FIELD

The present invention relates generally to fabrication of integrated circuits, and more particularly, to a method for fabricating a shallow doped junction of an integrated circuit device having scaled down dimensions within a semiconductor substrate using a plurality of implantations to form a box-shaped implant profile such that the shallow doped junction has low sheet resistance.

BACKGROUND OF THE INVENTION

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

The present invention is described in reference to formation of a shallow doped junction with minimized sheet resistance as part of a MOSFET (Metal Oxide Semiconductor Field Effect Transistor). However, the present invention may be used for any other type of integrated circuit device aside from just the example of a MOSFET where a shallow doped junction with minimized sheet resistance improves the performance of the integrated circuit device.

Referring to FIG. 1, a common component of a monolithic IC is a MOSFET (Metal Oxide Semiconductor Field Effect Transistor) 100 which is fabricated within a semiconductor substrate 102. The scaled down MOSFET 100 having submicron or nanometer dimensions includes a drain extension 104 and a source extension 106 formed within an active device area 126 of the semiconductor substrate 102. The drain extension 104 and the source extension 106 are shallow doped junctions to minimize short-channel effects in the MOSFET 100 having submicron or nanometer dimensions, as known to one of ordinary skill in the art of integrated circuit fabrication.

The MOSFET 100 further includes a drain contact junction 108 with a drain silicide 110 for providing contact to the drain of the MOSFET 100 and includes a source contact junction 112 with a source silicide 114 for providing contact to the source of the MOSFET 100. The drain contact junction 108 and the source contact junction 112 are fabricated as deeper junctions such that a relatively large size of the drain silicide 110 and the source silicide 114 respectively may be fabricated therein to provide low resistance contact to the drain and the source respectively of the MOSFET 100.

The MOSFET 100 further includes a gate dielectric 116 and a gate structure 118 which may be a polysilicon gate. A gate silicide 120 is formed on the polysilicon gate 118 for providing contact to the polysilicon gate 118. The MOSFET 100 is electrically isolated from other integrated circuit devices within the semiconductor substrate 102 by shallow trench isolation structures 121. The shallow trench isolation structures 121 define the active device area 126, within the semiconductor substrate 102, where a MOSFET is fabricated therein.

The MOSFET 100 also includes a spacer 122 disposed on the sidewalls of the polysilicon gate 118 and the gate oxide 116. When the spacer 122 is comprised of silicon nitride (SiN), then a spacer liner oxide 124 is deposited as a buffer layer between the spacer 122 and the sidewalls of the polysilicon gate 118 and the gate oxide 116.

Referring to FIG. 1, as dimensions of the MOSFET 100 are scaled further down to tens of nanometers, the drain extension 104 and the source extension 106 are desired to be abrupt and shallow junctions to minimize short-channel effects of the MOSFET 100, as known to one of ordinary skill in the art of integrated circuit fabrication. In addition, for enhancing the speed performance of the MOSFET 100 with scaled down dimensions, a low sheet resistance is desired for the junctions of the drain extension 104 and the source extension 106.

Dopant within the drain extension 104 and the source extension 106 is activated typically using a RTA (Rapid Thermal Anneal) process, as known to one of ordinary skill in the art of integrated circuit fabrication. As dimensions of the MOSFET 100 are further scaled down, a lower temperature is desired for the RTA process because thermal diffusion of the dopant within the drain extension 104 and the source extension 106 causes the drain extension 104 and the source extension 106 to become less shallow. Thus, an amorphization implant is performed in the drain extension 104 and the source extension 106 before implantation of the dopant in the drain extension 104 and the source extension 106. The amorphization implant lowers the melting temperature of the drain extension 104 and the source extension 106 such that activation of dopant within the drain extension 104 and the source extension 106 may be performed at a lower temperature.

Referring to FIG. 2, an amorphization implant profile 200 illustrates the concentration of an amorphizing implant species implanted into the semiconductor substrate 102. Referring to FIGS. 1 and 2, the x-axis of the amorphization implant profile 200 indicates the depth of the semiconductor substrate 102 from a top surface 130 of the semiconductor substrate 102. The y-axis of the amorphization implant profile 200 indicates the concentration of the amorphizing implant species implanted into a particular depth of the semiconductor substrate 102.

The amorphization implant profile 200 is typically a Gaussian shape, as known to one of ordinary skill in the art of integrated circuit fabrication. For fabrication of shallow doped junctions for the drain extension 104 and the source extension 106, the amorphizing implant species may be a heavy dopant species such as indium (In), arsenic (As), and antimony (Sb), for example, such that the amorphization implant profile 200 is relatively narrow.

For implantation of the relatively heavy dopant species, a high implantation energy may be used. However, with a high implantation energy, the amorphization implant profile 200 may be buried beneath the top surface 130 of the semiconductor substrate 102, as illustrated in FIG. 2. (Referring to FIGS. 1 and 2, the origin 201 of the x-axis in FIG. 2 represents the top surface 130 of the semiconductor substrate 102.) Referring to FIG. 2, the buried amorphization implant profile 200 is disadvantageous because an amorphization implant profile that is buried results in a doped junction with higher sheet resistance. In addition, the buried amorphization implant profile 200 has a first dislocation interface 202 and a second dislocation interface 204 where the concentration of the amorphizing implant species rapidly diminishes. Two such dislocation interfaces 202 and 204 may result in a doped junction with higher sheet resistance.

After implantation of the amorphizing implant species for forming a junction, dopant is implanted into the semiconductor substrate 102. Referring to FIG. 3, a dopant implant profile 300 illustrates the concentration of a dopant implant species implanted into the semiconductor substrate 102. Referring to FIGS. 1 and 3, the x-axis of the dopant implant profile 300 indicates the depth of the semiconductor substrate 102 from a top surface 130 of the semiconductor substrate 102. The y-axis of the dopant implant profile 300 indicates the concentration of the dopant implant species implanted into a particular depth of the semiconductor substrate 102. The dopant implant profile 300 is typically a Gaussian shape, as known to one of ordinary skill in the art of integrated circuit fabrication.

In the prior art, for minimizing resistance of a junction, a relatively high concentration of the dopant implant species may be implanted into the junction. However, in a RTA (Rapid Thermal Anneal) process for activating the dopant implant species within the junction, the activation of the dopant implant species is limited by the solid solubility of the dopant implant species within the semiconductor substrate 102, as known to one of ordinary skill in the art of integrated circuit fabrication.

Thus, referring to FIG. 3, if a dashed line 302 indicates the solid solubility of the dopant implant species within the semiconductor substrate 102, then the extra dopant implant species above the dashed line 302 is not activated during the RTA process. Such extraneous dopant implant species results in an increase in the sheet resistance of the doped junction because of an increase in impurity scattering from the extraneous dopant implant species within the doped junction.

In addition, the dopant implant profile 300 may also be a buried implant profile. (Referring to FIGS. 1 and 3, the origin 301 of the x-axis in FIG. 3 represents the top surface 130 of the semiconductor substrate 102.) Such a buried implant profile 300 may result in less concentration of the dopant implant species toward the top surface 130 of the semiconductor substrate 102 such that the doped junction has higher sheet resistance.

Nevertheless, as the MOSFET is further scaled down, a doped junction with minimized sheet resistance is desired for the drain extension 104 and the source extension 106 of the MOSFET for enhanced speed performance of the MOSFET. Thus, a process is desired for fabricating a doped junction by forming box-shaped implant profiles for the amorphization implant and/or the dopant implant such that the sheet resistance of the doped junction is minimized.

SUMMARY OF THE INVENTION

Accordingly, in a general aspect of the present invention, a shallow doped junction that is part of an integrated circuit device within a semiconductor substrate is formed with box-shaped implant profiles for implantation of the amorphizing implant species and/or the dopant implant species.

In one embodiment of the present invention, the amorphizing implant species is implanted to form an amorphous region with a first plurality of projection ranges to form a first plurality of implant profiles such that the first plurality of implant profiles results in a first substantially box-shaped implant profile. A top of the first substantially box-shaped implant profile is substantially at the top surface of the semiconductor substrate, and the first substantially box-shaped implant profile has a first depth from the top surface of the semiconductor substrate.

In another embodiment of the present invention, the dopant implant species is implanted in the amorphous region with a second plurality of projection ranges to form a second plurality of implant profiles such that the second plurality of implant profiles results in a second substantially box-shaped implant profile. In that case, a top of the second substantially box-shaped implant profile is substantially at the top surface of the semiconductor substrate, and the second substantially box-shaped implant profile has a second depth from the top surface of the semiconductor substrate.

In one aspect of the present invention, the second depth of the second substantially box-shaped implant profile of the dopant implant species is less than the first depth of the first substantially box-shaped implant profile of the amorphizing implant species. Furthermore, the present invention may be used to particular advantage when each of the second plurality of implant profiles is below a solid solubility of the dopant implant species in the semiconductor substrate.

In this manner, by controlling the implant profiles of the amorphizing implant species and/or the dopant implant species during fabrication of the doped junction, the sheet resistance of the doped junction is effectively minimized. In addition, the temperature and the time period for activating the dopant implant species in a RTA (Rapid Thermal Anneal) process is also minimized such that the doped junction remains relatively shallow.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, and 8 refer to elements having similar structure and function.

DETAILED DESCRIPTION

Figure 1:
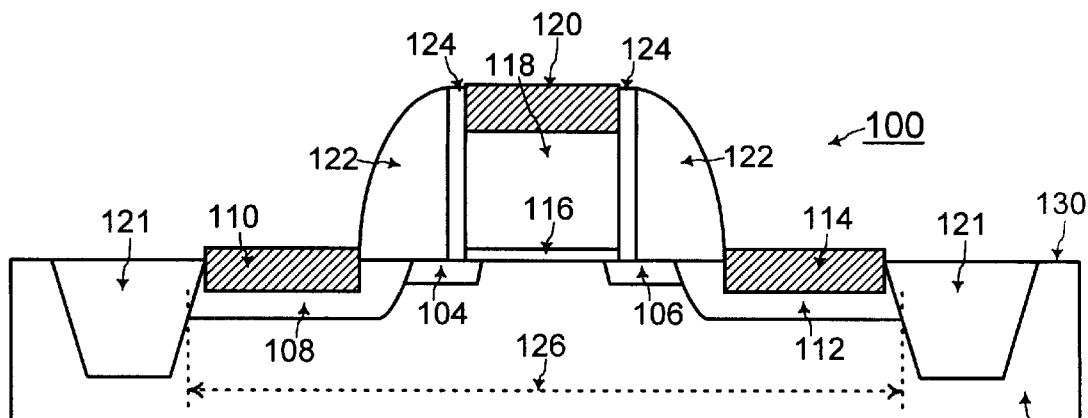
FIG. 1 shows a cross-sectional view of a MOSFET (Metal Oxide Semiconductor Field Effect Transistor) having drain and source contact junctions and drain and source extension implants.
Figure 4:
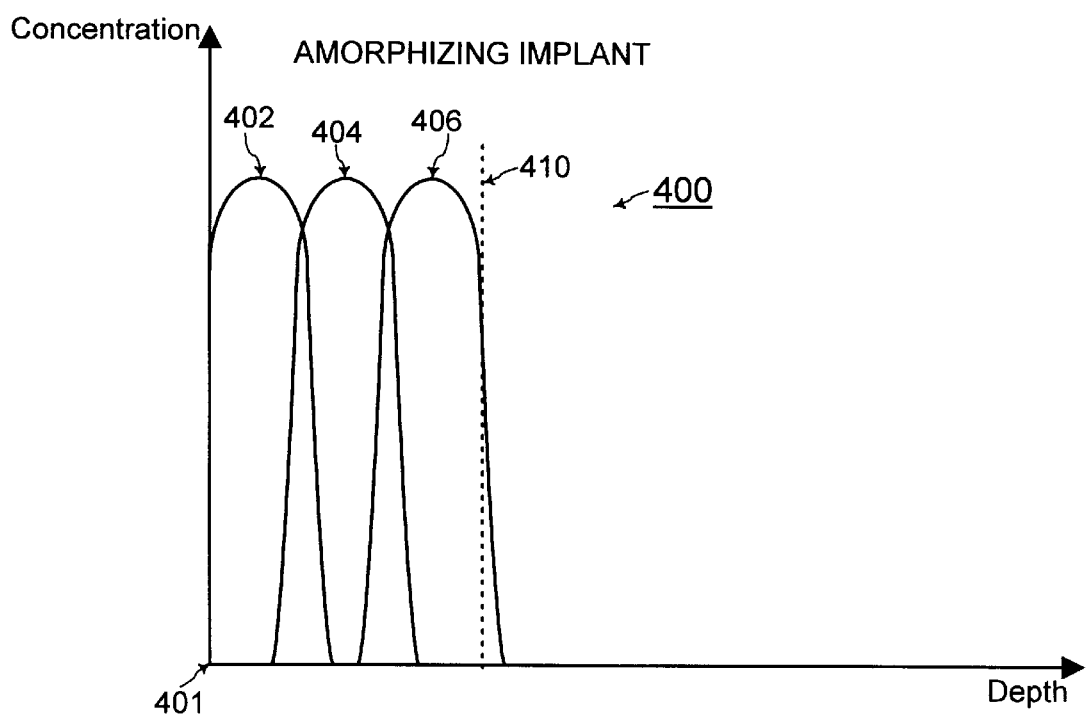
FIG. 4 shows a substantially box-shaped implant profile formed after implantation of an amorphizing implant species, according to the present invention.

Referring to FIGS. 1 and 4, in a general aspect of the present invention, for formation of a shallow doped junction with minimized sheet resistance, a first implant profile 400 is formed from implantation of an amorphizing implant species into the semiconductor substrate 102 to form an amorphous region within the semiconductor substrate 102. Referring to FIG. 4, the first implant profile 400 illustrates the concentration of the amorphizing implant species implanted into various depths of the semiconductor substrate 102.

Referring to FIGS. 1 and 4, the x-axis of the first implant profile 400 indicates the depth of the semiconductor substrate 102 from a top surface 130 of the semiconductor substrate 102. (Referring to FIGS. 1 and 4, the origin 401 of the x-axis in FIG. 4 represents the top surface 130 of the semiconductor substrate 102.) The y-axis of the first implant profile 400 indicates the concentration of the amorphizing implant species implanted into a particular depth of the semiconductor substrate 102.

The first implant profile 400 is comprised of a plurality of amorphizing implant profiles including a first amorphizing implant profile 402, a second amorphizing implant profile 404, and a third amorphizing implant profile 406 in the example of FIG. 4. The plurality of amorphizing implant profiles 402, 404, and 406 result from implantation of the amorphizing implant species at a plurality of projection ranges. The projection range of an implant profile is controlled by variation of the implantation energy in a conventional implantation system, as known to one of ordinary skill in the art of integrated circuit fabrication.

Each of the plurality of amorphizing implant profiles 402, 404, and 406 is typically a Gaussian shape, as known to one of ordinary skill in the art of integrated circuit fabrication. The sum of the effect of the plurality of amorphizing implant profiles 402, 404, and 406 results in the first implant profile 400 that is substantially box shaped, as illustrated in FIG. 4.

In addition, the projection ranges of the plurality of amorphizing implant profiles 402, 404, and 406 are controlled such that a top of the first implant profile 400 is substantially at the top surface 130 of the semiconductor substrate 102. In that case, only one dislocation interface results at a first depth 410 of the first implant profile 400 where the concentration of the amorphizing implant species rapidly diminishes. The first depth 410 of the first implant profile 400 defines an amorphous region within the semiconductor substrate 102 formed by implantation of the amorphizing implant species.

The amorphizing implant species may be a neutral species selected from a group comprising silicon (Si), germanium (Ge), and xenon (Xe), for example, as known to one of ordinary skill in the art of integrated circuit fabrication. Alternatively, for fabrication of an especially shallow junction, the amorphizing implant species may be a heavy dopant species such as indium (In), arsenic (As), and antimony (Sb), for example, such that each of the plurality of amorphizing implant profiles 402, 404, and 406 is relatively narrow.

Figure 2:
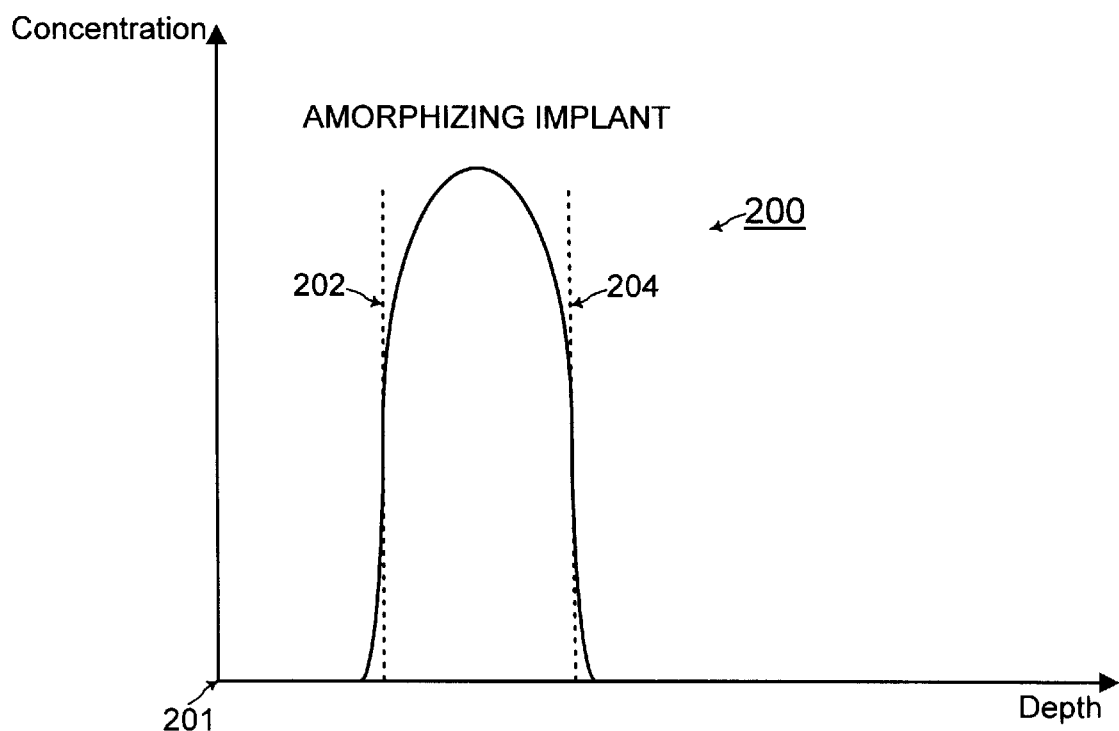
FIG. 2 shows a buried implant profile formed after implantation of an amorphizing implant species, according to the prior art.

In this manner, by forming an implant profile 400 that is substantially box-shaped for the implantation of the amorphizing implant species, the sheet resistance of the doped junction is minimized because of the more uniform concentration of the amorphizing implant species within the amorphous region. Referring to FIGS. 2 and 4, because the amorphizing implant species is already relatively uniformly distributed within the amorphous region of the present invention, the activation temperature and the activation time of the RTA (Rapid Thermal Anneal) process may be decreased. For example, the RTA process may use a relatively low temperature in a range of approximately 550° Celsius to 700° Celsius for a relatively short time period of 60 seconds. Such lower activation temperature and activation time results in less thermal diffusion and thus in a shallower doped junction. Furthermore, referring to FIGS. 2 and 4, because the implant profile 400 of the present invention has only one dislocation interface 410 (instead of two dislocation interfaces 202 and 204 in the prior art of FIG. 2), the sheet resistance of the doped junction of the present invention is further minimized.

Figure 5:
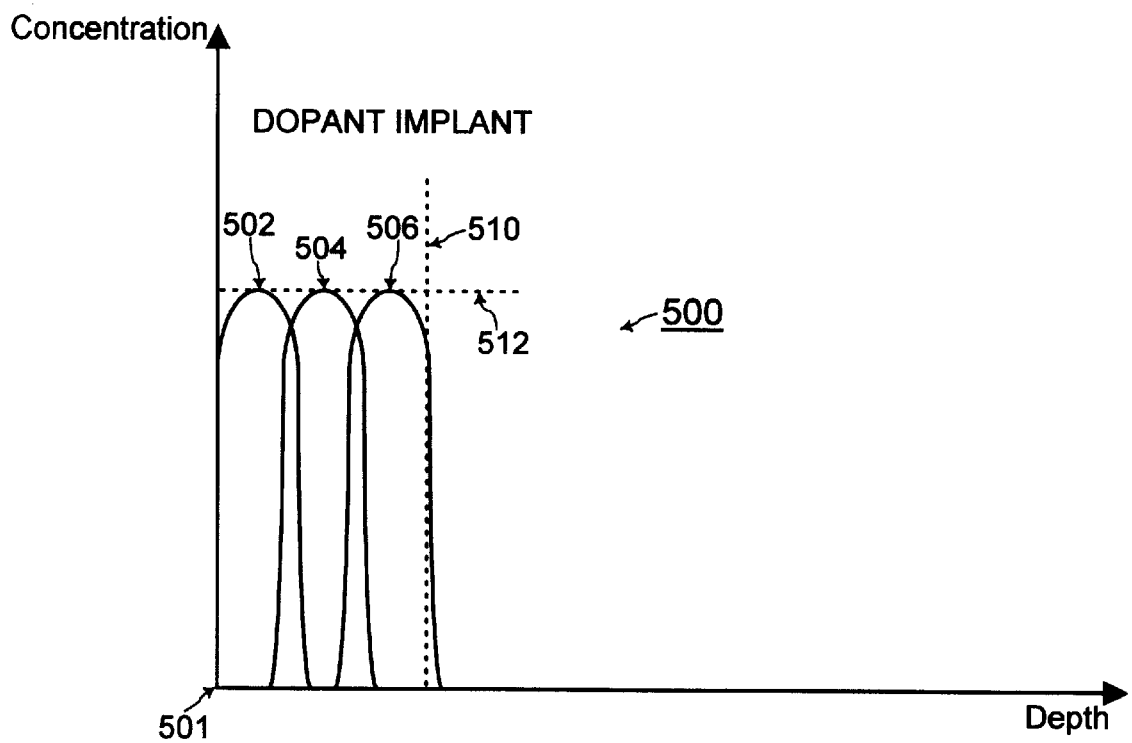
FIG. 5 shows a substantially box-shaped implant profile formed after implantation of a dopant implant species with concentrations substantially at the solid solubility of the dopant implant species within the semiconductor substrate, according to the present invention.

Referring to FIG. 5, in a general aspect of the present invention, for formation of a shallow doped junction with further minimized sheet resistance, a second implant profile 500 is formed from implantation of a dopant implant species into the amorphous region of the semiconductor substrate 102. The dopant implant species is typically later implanted into the amorphous region formed by the earlier implantation of the amorphizing implant species. Thus, for the example of fabrication of a MOSFET, the dopant implant species is an N-type dopant when the MOSFET is an NMOSFET (N-channel Metal Oxide Semiconductor Field Effect Transistor) and is a P-type dopant when the MOSFET is a PMOSFET (P-channel Metal Oxide Semiconductor Field Effect Transistor).

Referring to FIG. 5, the second implant profile 500 illustrates the concentration of the dopant implant species implanted into various depths of the semiconductor substrate 102. Referring to FIGS. 1 and 5, the x-axis of the second implant profile 500 indicates the depth of the semiconductor substrate 102 from a top surface 130 of the semiconductor substrate 102. (Referring to FIGS. 1 and 5, the origin 501 of the x-axis in FIG. 5 represents the top surface 130 of the semiconductor substrate 102.) The y-axis of the second implant profile 500 indicates the concentration of the dopant implant species implanted into a particular depth of the semiconductor substrate 102.

The second implant profile 500 is comprised of a plurality of dopant implant profiles including a first dopant implant profile 502, a second dopant implant profile 504, and a third dopant implant profile 506 in the example of FIG. 5. The plurality of dopant implant profiles 502, 504, and 506 result from implantation of the dopant implant species at a plurality of projection ranges. The projection range of an implant profile is controlled by variation of the implantation energy in a conventional implantation system, as known to one of ordinary skill in the art of integrated circuit fabrication.

Each of the plurality of dopant implant profiles 502, 504, and 506 is typically a Gaussian shape, as known to one of ordinary skill in the art of integrated circuit fabrication. The sum of the effect of the plurality of dopant implant profiles 502, 504, and 506 results in the second implant profile 500 that is substantially box shaped, as illustrated in FIG. 5. In addition, the projection ranges of the plurality of dopant implant profiles 502, 504, and 506 are controlled such that a top of the second implant profile 500 is substantially at the top surface 130 of the semiconductor substrate 102 such that the second implant profile 500 is not buried.

Referring to FIGS. 4 and 5, a second depth 510 of the second implant profile 500 is preferably less than the first depth 410 of the first implant profile 400. With such depths of the first and second implant profiles 400 and 500, a relatively large portion of the dopant implant species remains within the amorphous region even after activation of the dopant implant species by an RTA (Rapid Thermal Anneal) process such that the dopant implant species is conserved.

Furthermore referring to FIG. 5, the concentration of each of the plurality of dopant implant profiles 502, 504, and 506 is below the dashed line 512 representing the solid solubility of the dopant implant species within the semiconductor substrate 102. In this manner, the conductivity of the dopant implant species is optimized to the solid solubility of the dopant implant species within the semiconductor substrate 102. Thus, because extraneous dopant implant species beyond the solid solubility of the dopant implant species within the semiconductor substrate 102 is not present, impurity scattering is minimized with the present invention resulting in further minimization of the sheet resistance of the doped junction.

Figure 3:
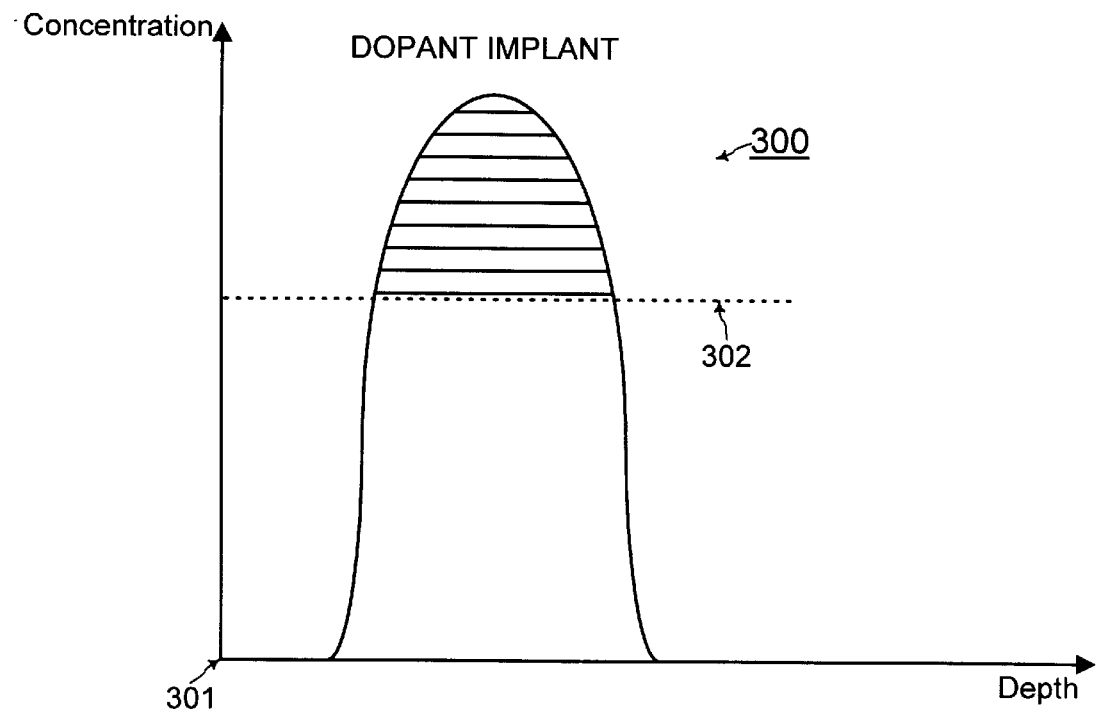
FIG. 3 shows a buried implant profile formed after implantation of a dopant implant species having concentrations above the solid solubility of the dopant implant species within the semiconductor substrate, according to the prior art.

Additionally, by forming an implant profile 500 that is substantially box-shaped for the implantation of the dopant implant species, the sheet resistance of the doped junction is minimized because of the more uniform concentration of the dopant implant species. Referring to FIGS. 3 and 5, because the dopant implant species is already relatively uniformly distributed within the amorphous region of the present invention, the activation temperature and the activation time of the RTA (Rapid Thermal Anneal) process may be decreased. For example, the RTA process may use a relatively low temperature in a range of approximately 550° Celsius to 700° Celsius for a relatively short time period of 60 seconds. Such lower activation temperature and activation time results in less thermal diffusion and thus in a shallower doped junction.

Figure 6:
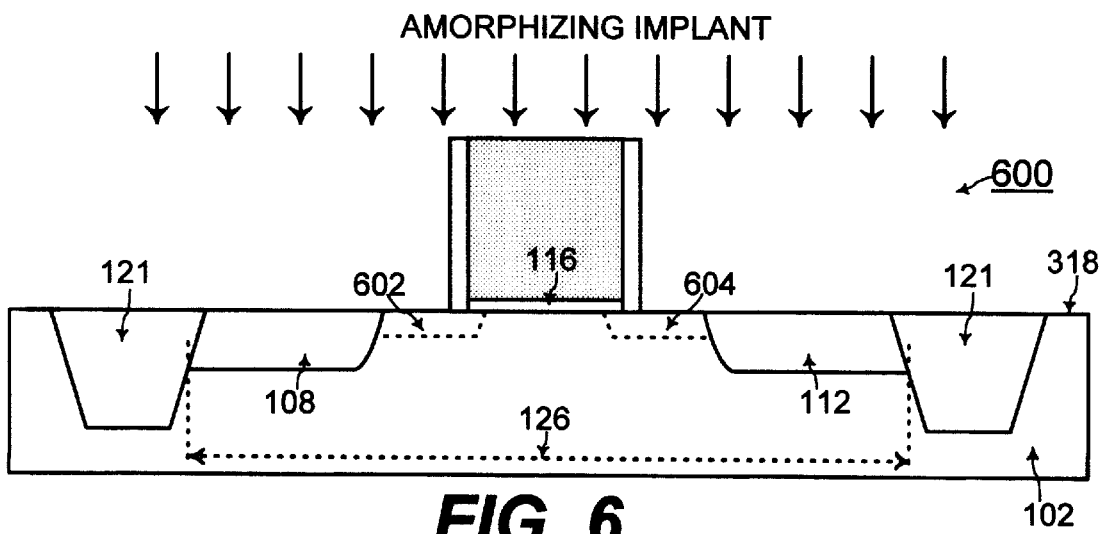
FIGS. 6, 7, and 8 show cross-sectional views of a MOSFET fabricated according to the present invention for illustrating the steps for formation of drain and source extensions of such a MOSFET with implantation of the amorphizing implant species and the dopant implant species having the substantially box-shaped implant profiles of FIGS. 4 and 5 of the present invention.

Referring to FIG. 6, the shallow doped junctions formed according to the present invention may advantageously be used as drain and source extensions of a MOSFET 600 having scaled down dimensions. In that case, referring to FIGS. 1 and 6, after the drain contact junction 108 and the source contact junction 112 are formed, the spacer 122 is etched from the sidewalls of the gate structure 118. Implantation of the amorphizing implant species is performed to form a drain amorphous region 602 and a source amorphous region 604 in accordance with formation of a plurality of amorphizing implant profiles such as that illustrated in FIG. 4 of the present invention.

Figure 7:
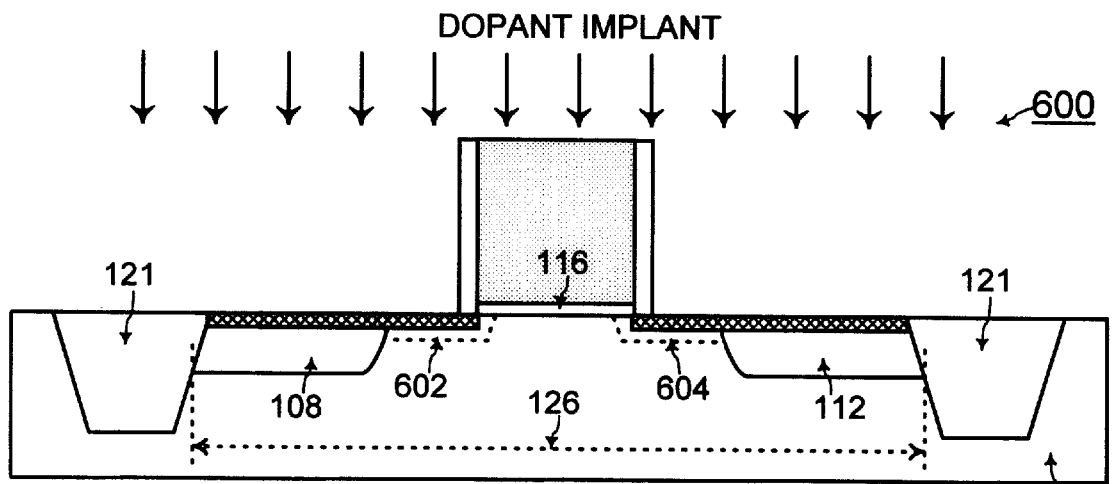
Figure 8:
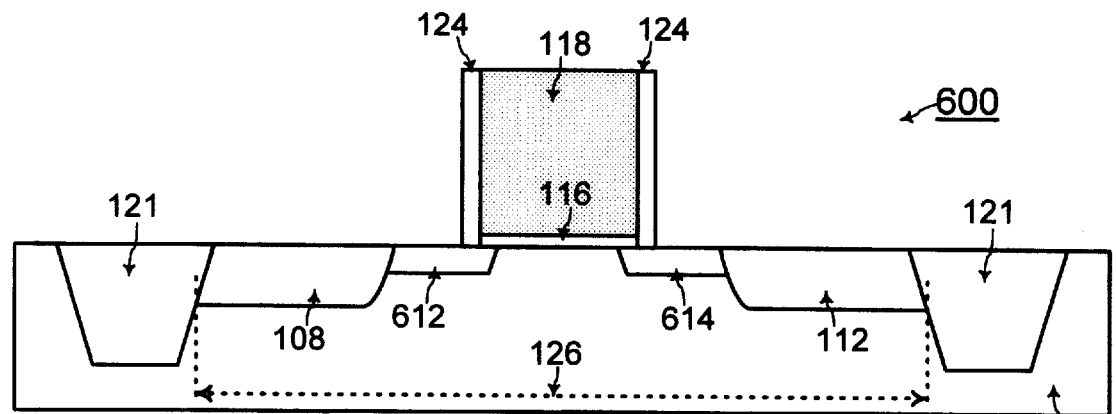

Referring to FIG. 7, the dopant implant species is then implanted into the drain amorphous region 602 and the source amorphous region 604 in accordance with formation of a plurality of dopant implant profiles such as that illustrated in FIG. 5 of the present invention. The dopant implant species is an N-type dopant when the MOSFET is an NMOSFET (N-channel Metal Oxide Semiconductor Field Effect Transistor) and is a P-type dopant when the MOSFET is a PMOSFET (P-channel Metal Oxide Semiconductor Field Effect Transistor). Referring to FIG. 8, the dopant implant species is activated within the drain amorphous region 602 and the source amorphous region 604 to form a drain extension 612 and a source extension 614, respectively, of the MOSFET 600. In accordance with the present invention, the drain extension 612 and the source extension 614 are shallow doped junctions with minimized sheet resistance for enhanced speed performance of the MOSFET 600.

The foregoing is by way of example only and is not intended to be limiting. For example, any number of amorphizing implant profiles and any number of dopant implant profiles may be used for forming the substantially box-shaped implant profiles of the present invention.

In addition, the present invention is described in reference to formation of a shallow doped junction with minimized sheet resistance as part of a MOSFET (Metal Oxide Semiconductor Field Effect Transistor). However, the present invention may be used for any other type of integrated circuit device aside from just the example of a MOSFET where a shallow doped junction with minimized sheet resistance improves the performance of the integrated circuit device.

Furthermore, as will be understood by those skilled in the art, the structures described herein may be made or used in the same way regardless of their position and orientation. Accordingly, it is to be understood that terms and phrases such as "top" and "depth" as used herein refer to relative location and orientation of various portions of the structures with respect to one another, and are not intended to suggest that any particular absolute orientation with respect to external objects is necessary or required.

The present invention is limited only as defined in the following claims and equivalents thereof.

I claim:

1. A method for fabricating a doped junction as part of an integrated circuit device within a semiconductor substrate, the method including the steps of:

A. implanting an amorphizing implant species to form an amorphous region;

B. implanting a dopant implant species in said amorphous region;

wherein at least one of said amorphizing implant species and said dopant implant species is implanted with a plurality of projection ranges to form a plurality of implant profiles such that said plurality of implant profiles results in a substantially box-shaped implant profile;

and wherein a top of said box-shaped implant profile is substantially at a top surface of said semiconductor substrate; and C. activating said dopant implant species within said amorphous region by heating said amorphous region.

2. The method of claim 1, further including the steps of:

implanting said amorphizing implant species to form said amorphous region with a first plurality of projection ranges to form a first plurality of implant profiles such that said first plurality of implant profiles results in a first substantially box-shaped implant profile;

wherein a top of said first substantially box-shaped implant profile is substantially at said top surface of said semiconductor substrate, and wherein said first substantially box-shaped implant profile has a first depth from said top surface of said semiconductor substrate; and implanting said dopant implant species in said amorphous region with a second plurality of projection ranges to form a second plurality of implant profiles such that said second plurality of implant profiles results in a second substantially box-shaped implant profile;

and wherein a top of said second substantially box-shaped implant profile is substantially at said top surface of said semiconductor substrate, and wherein said second substantially box-shaped implant profile has a second depth from said top surface of said semiconductor substrate;

and wherein said second depth of said second substantially box-shaped implant profile of said dopant implant species is less than said first depth of said first substantially box-shaped implant profile of said amorphizing implant species.

3. The method of claim 2, wherein each of said second plurality of implant profiles is below a solid solubility of said dopant implant species in said semiconductor substrate.

4. The method of claim 2, wherein said amorphizing implant species is a neutral species selected from a group comprising silicon (Si), germanium (Ge), and xenon (Xe).

5. The method of claim 2, wherein said amorphizing implant species is a heavy dopant species selected from a group comprising indium (In), arsenic (As), and antimony (Sb).

6. The method of claim 2, wherein said step C further includes a RTA (Rapid Thermal Anneal) process for heating said amorphous region to a temperature in a range of approximately 550° Celsius to 700° Celsius to activate said dopant implant species within said amorphous region.

7. The method of claim 6, wherein said amorphous region is heated to said temperature in said range of approximately 550° Celsius to 700° Celsius for a time period of approximately 60 seconds to activate said dopant implant species within said amorphous region.

8. The method of claim 2, wherein said doped junction forms one of a drain extension and a source extension of a MOSFET (Metal Oxide Semiconductor Field Effect Transistor).

9. The method of claim 8, wherein said dopant implant species is comprised of an N-type dopant for fabricating an NMOSFET (N-channel Metal Oxide Semiconductor Field Effect Transistor).

10. The method of claim 8, wherein said dopant implant species is comprised of a P-type dopant for fabricating a PMOSFET (P-channel Metal Oxide Semiconductor Field Effect Transistor).

11. The method of claim 1, wherein each implant profile for said dopant implant species is below a solid solubility of said dopant implant species in said semiconductor substrate.

12. The method of claim 1, wherein said amorphizing implant species is a neutral species selected from a group comprising silicon (Si), germanium (Ge), and xenon (Xe).

13. The method of claim 1, wherein said amorphizing implant species is a heavy dopant species selected from a group comprising indium (In), arsenic (As), and antimony (Sb).

14. The method of claim 1, wherein said step C further includes a RTA (Rapid Thermal Anneal) process for heating said amorphous region to a temperature in a range of approximately 550° Celsius to 700° Celsius to activate said dopant implant species within said amorphous region.

15. The method of claim 14, wherein said amorphous region is heated to said temperature in said range of approximately 550° Celsius to 700° Celsius for a time period of approximately 60 seconds to activate said dopant implant species within said amorphous region.

16. The method of claim 1, wherein said doped junction forms one of a drain extension and a source extension of a MOSFET (Metal Oxide Semiconductor Field Effect Transistor).

17. The method of claim 16, wherein said dopant implant species is comprised of an N-type dopant for fabricating an NMOSFET (N-channel Metal Oxide Semiconductor Field Effect Transistor).

18. The method of claim 16, wherein said dopant implant species is comprised of a P-type dopant for fabricating a PMOSFET (P-channel Metal Oxide Semiconductor Field Effect Transistor).

19. A method for fabricating a doped junction as part of an integrated circuit device within a semiconductor substrate, the method including the steps of:

A. implanting an amorphizing implant species to form an amorphous region with a first plurality of projection ranges to form a first plurality of implant profiles such that said first plurality of implant profiles results in a first substantially box-shaped implant profile;

wherein a top of said first substantially box-shaped implant profile is substantially at a top surface of said semiconductor substrate, and wherein said first substantially box-shaped implant profile has a first depth from said top surface of said semiconductor substrate;

and wherein said amorphizing implant species is a heavy dopant species selected from a group comprising indium (In), arsenic (As), and antimony (Sb);

B. implanting a dopant implant species in said amorphous region with a second plurality of projection ranges to form a second plurality of implant profiles such that said second plurality of implant profiles results in a second substantially box-shaped implant profile;

and wherein a top of said second substantially box-shaped implant profile is substantially at said top surface of said semiconductor substrate, and wherein said second substantially box-shaped implant profile has a second depth from said top surface of said semiconductor substrate;

and wherein said second depth of said second substantially box-shaped implant profile of said dopant implant species is less than said first depth of said first substantially box-shaped implant profile of said amorphizing implant species;

and wherein each of said second plurality of implant profiles is below a solid solubility of said dopant implant species in said semiconductor substrate; and C. activating said dopant implant species within said amorphous region by heating said amorphous region in a RTA (Rapid Thermal Anneal) process at a temperature in a range of approximately 550° Celsius to 700° Celsius for a time period of approximately 60 seconds to activate said dopant implant species within said amorphous region;

and wherein said doped junction forms one of a drain extension and a source extension of a MOSFET (Metal Oxide Semiconductor Field Effect Transistor);

and wherein said dopant implant species is one of an N-type dopant for fabrication of an NMOSFET (N-channel Metal Oxide Semiconductor Field Effect Transistor) and of a P-type dopant for fabrication of a PMOSFET (P-channel Metal Oxide Semiconductor Field Effect Transistor).

* * * * *